United States Patent
Ito

(10) Patent No.: US 11,149,358 B2
(45) Date of Patent: Oct. 19, 2021

(54) VAPOR PHASE GROWTH APPARATUS COMPRISING N REACTORS, A PRIMARY GAS SUPPLY PATH, A MAIN SECONDARY GAS SUPPLY PATH, (N−1) AUXILIARY SECONDARY GAS SUPPLY PATHS, A FIRST CONTROL CIRCUIT, AND A SECOND CONTROL CIRCUIT

(71) Applicant: NuFlare Technology, Inc., Kanagawa (JP)

(72) Inventor: Hideki Ito, Yokohama (JP)

(73) Assignee: NuFlare Technology, Inc., Kanagawa (JP)

(*) Notice: Subject to any disclaimer, the term of this patent is extended or adjusted under 35 U.S.C. 154(b) by 129 days.

(21) Appl. No.: 16/671,618

(22) Filed: Nov. 1, 2019

(65) Prior Publication Data

US 2020/0149187 A1 May 14, 2020

(30) Foreign Application Priority Data

Nov. 9, 2018 (JP) .............................. JP2018-211261

(51) Int. Cl.
*C30B 35/00* (2006.01)
*C30B 25/16* (2006.01)
(Continued)

(52) U.S. Cl.
CPC ............ *C30B 25/165* (2013.01); *C23C 16/24* (2013.01); *C23C 16/34* (2013.01);
(Continued)

(58) Field of Classification Search
CPC ......... C30B 25/00; C30B 25/02; C30B 25/14; C30B 25/16; C30B 25/165; C30B 29/00;
(Continued)

(56) References Cited

U.S. PATENT DOCUMENTS

| | | | |
|---|---|---|---|
| 2011/0265895 A1 | 11/2011 | Okabe | |
| 2016/0032488 A1* | 2/2016 | Takahashi | ............. C30B 29/406 117/86 |
| 2017/0062212 A1 | 3/2017 | Sato et al. | |

FOREIGN PATENT DOCUMENTS

| | | |
|---|---|---|
| CN | 102235573 A | 11/2011 |
| JP | 2017-045927 | 3/2017 |

OTHER PUBLICATIONS

Chinese Office Action (CNOA) dated Jul. 29, 2021 for the corresponding Chinese Patent Application No. 201911079497.X and its English mchine trasnlation.

* cited by examiner

*Primary Examiner* — Kenneth A Bratland, Jr.
(74) *Attorney, Agent, or Firm* — Rankin, Hill & Clark LLP

(57) ABSTRACT

A vapor phase growth apparatus includes n (n is an integer of 2 or more) reactors; a primary gas supply path supplying a mixed gas to the reactors; n secondary gas supply paths connected to one of the reactors including a main secondary gas supply path and (n−1) auxiliary secondary gas supply paths; a first pressure gauge; a main flow rate controller provided in the main secondary gas supply path; (n−1) auxiliary flow rate controllers provided in the auxiliary secondary gas supply paths; a first control circuit instructing a first flow rate value; and a second control circuit calculating a second flow rate value being 1/n of a sum of a flow rate value measured by the main flow rate controller and flow rate values measured by the auxiliary flow rate controllers, and instructing the second flow rate value to the auxiliary flow rate controllers.

11 Claims, 4 Drawing Sheets

(51) Int. Cl.
  *C30B 25/14*    (2006.01)
  *C30B 29/06*    (2006.01)
  *C23C 16/44*    (2006.01)
  *C23C 16/34*    (2006.01)
  *C30B 29/40*    (2006.01)
  *C23C 16/52*    (2006.01)
  *C23C 16/24*    (2006.01)
  *H01L 21/67*    (2006.01)
  C23C 16/455    (2006.01)

(52) U.S. Cl.
  CPC .......... *C23C 16/4412* (2013.01); *C23C 16/52* (2013.01); *C30B 25/14* (2013.01); *C30B 29/06* (2013.01); *C30B 29/406* (2013.01); *H01L 21/67155* (2013.01); C23C 16/45557 (2013.01)

(58) Field of Classification Search
  CPC ......... C30B 29/10; C30B 29/06; C30B 29/40; C30B 29/403; C30B 29/406; C30B 35/00; C30B 35/002; C23C 16/24; C23C 16/34; C23C 16/4412; C23C 16/52; C23C 16/45557; H01L 21/67155
  USPC ................ 117/84–86, 88–89, 102, 104–105, 117/200–202, 204, 97, 952; 118/715, 719
  See application file for complete search history.

VAPOR PHASE GROWTH APPARATUS COMPRISING N REACTORS, A PRIMARY GAS SUPPLY PATH, A MAIN SECONDARY GAS SUPPLY PATH, (N−1) AUXILIARY SECONDARY GAS SUPPLY PATHS, A FIRST CONTROL CIRCUIT, AND A SECOND CONTROL CIRCUIT

CROSS-REFERENCE TO RELATED APPLICATION

This application is based upon and claims the benefit of priority from Japanese Patent Applications No. 2018-211261, filed on Nov. 9, 2018, the entire contents of which are incorporated herein by reference.

FIELD OF THE INVENTION

Embodiments relate to a vapor phase growth apparatus that forms a film on a substrate by supplying a gas.

BACKGROUND OF THE INVENTION

As a method for forming a high-quality semiconductor film, there is an epitaxial growth technique in which a single crystal film is grown on a substrate such as a wafer by vapor phase growth. In a vapor phase growth apparatus using an epitaxial growth technique, a wafer is mounted on a support unit in a reactor that is maintained at a normal pressure or a reduced pressure. Then, while heating the wafer, a process gas such as a source gas, which is a raw material for the semiconductor film, is supplied to a wafer surface from, for example, a shower plate above the reactor. A thermal reaction of the source gas occurs on the wafer surface, and an epitaxial single crystal film is formed on the wafer surface.

In recent years, gallium nitride (GaN)-based semiconductor devices have attracted attention as materials for light-emitting devices and power devices. As an epitaxial growth technique for forming a GaN-based semiconductor, there is a metal organic chemical vapor deposition method (MOCVD method). In the metal organic chemical vapor deposition method, an organic metal such as trimethylgallium (TMG), trimethylindium (TMI), or trimethylaluminum (TMA), and ammonia ($NH_3$), or the like are used as source gases.

Further, in order to improve productivity, in some cases, a vapor phase growth apparatus provided with a plurality of reactors may be used. Japanese published patent application 2017-45927 discloses a vapor phase growth apparatus including a plurality of reactors. In order to simultaneously form films having uniform characteristics in a plurality of reactors, it is desirable to control a flow rate of a process gas supplied to each reactor to be constant.

SUMMARY OF THE INVENTION

According to an aspect of embodiments, there is provided a vapor phase growth apparatus including: n (n is an integer of 2 or more) reactors; a primary gas supply path supplying a mixed gas including a first gas and a second gas to the reactors; n secondary gas supply paths branched from the primary gas supply path, each of the secondary gas supply paths connected corresponding to each of the n reactors, and the secondary gas supply paths including a main secondary gas supply path and (n−1) auxiliary secondary gas supply paths; a first pressure gauge measuring a pressure in the primary gas supply path; a main flow rate controller provided in the main secondary gas supply path; (n−1) auxiliary flow rate controllers each provided in one of the auxiliary secondary gas supply paths; a first control circuit instructing a first flow rate value to the main flow rate controller on the basis of a measurement result of the first pressure gauge; and a second control circuit calculating a second flow rate value, the second flow rate value being 1/n of a sum of a flow rate value measured by the main flow rate controller and flow rate values measured by the auxiliary flow rate controllers, the second control circuit instructing the second flow rate value to each of the auxiliary flow rate controllers.

According to another aspect of embodiments, there is provided a vapor phase growth apparatus including: n (n is an integer of 2 or more) reactors; a primary gas supply path supplying a gas to the reactors; n secondary gas supply paths branched from the primary gas supply path, each of the secondary gas supply paths connected to one of the reactors, and the secondary gas supply paths including a main secondary gas supply path and (n−1) auxiliary secondary gas supply paths; a first pressure gauge measuring a pressure in the primary gas supply path; a main flow rate controller provided in the main secondary gas supply path; (n−1) auxiliary flow rate controllers each provided in one of the auxiliary secondary gas supply paths; a first control circuit instructing a first flow rate value to the main flow rate controller on the basis of a measurement result of the first pressure gauge; and a second control circuit calculating a second flow rate value, the second flow rate value being 1/n of a sum of a flow rate value measured by the main flow rate controller and flow rate values measured by the auxiliary flow rate controllers, the second control circuit instructing the second flow rate value to the auxiliary flow rate controllers.

DETAILED DESCRIPTION OF THE EMBODIMENTS

Embodiments will be described below with reference to the drawings.

Incidentally, in this specification, the direction of gravity in a state where a vapor phase growth apparatus is installed so as to be capable of film formation is defined as "down", and the opposite direction is defined as "up". Therefore, the term "lower" denotes a position in the direction of gravity with respect to the reference, and the term "downward" denotes the direction of gravity with respect to the reference. Further, the term "upper" denotes a position opposite to the direction of gravity with respect to the reference, and the term "upward" denotes the direction opposite to the direction of gravity with respect to the reference. In addition, the term "vertical direction" is the direction of gravity.

In addition, in this specification, the term "process gas" is a general term for gases used for film formation on a substrate, and has a concept including, for example, a source gas, a carrier gas, and the like.

First Embodiment

A vapor phase growth apparatus according to a first embodiment includes: n (n is an integer of 2 or more) reactors; a primary gas supply path supplying a mixed gas includes a first gas and a second gas to the reactors; n secondary gas supply paths branched from the primary gas supply path, each of the secondary gas supply paths connected corresponding to each of the n reactors, and the secondary gas supply paths including a main secondary gas supply path and (n−1) auxiliary secondary gas supply paths; a first pressure gauge measuring a pressure in the primary gas supply path; a main flow rate controller provided in the main secondary gas supply path; (n−1) auxiliary flow rate controllers each provided in one of the auxiliary secondary gas supply paths; a first control circuit instructing a first flow rate value to the main flow rate controller on the basis of a measurement result of the first pressure gauge; and a second control circuit calculating a second flow rate value, the second flow rate value being 1/n of a sum of a flow rate value measured by the main flow rate controller and flow rate values measured by the auxiliary flow rate controllers, the second control circuit instructing the second flow rate value to each of the auxiliary flow rate controllers.

The vapor phase growth apparatus according to the first embodiment has the above-described configuration, and thus, at the time of simultaneously forming films on substrates in a plurality of reactors, the flow rates of the process gases supplied to the respective reactors can be controlled so as to be uniform. Therefore, it is possible to simultaneously form films having uniform characteristics in the respective reactors. The film characteristics are, for example, a film thickness and a composition.

Figure 1:
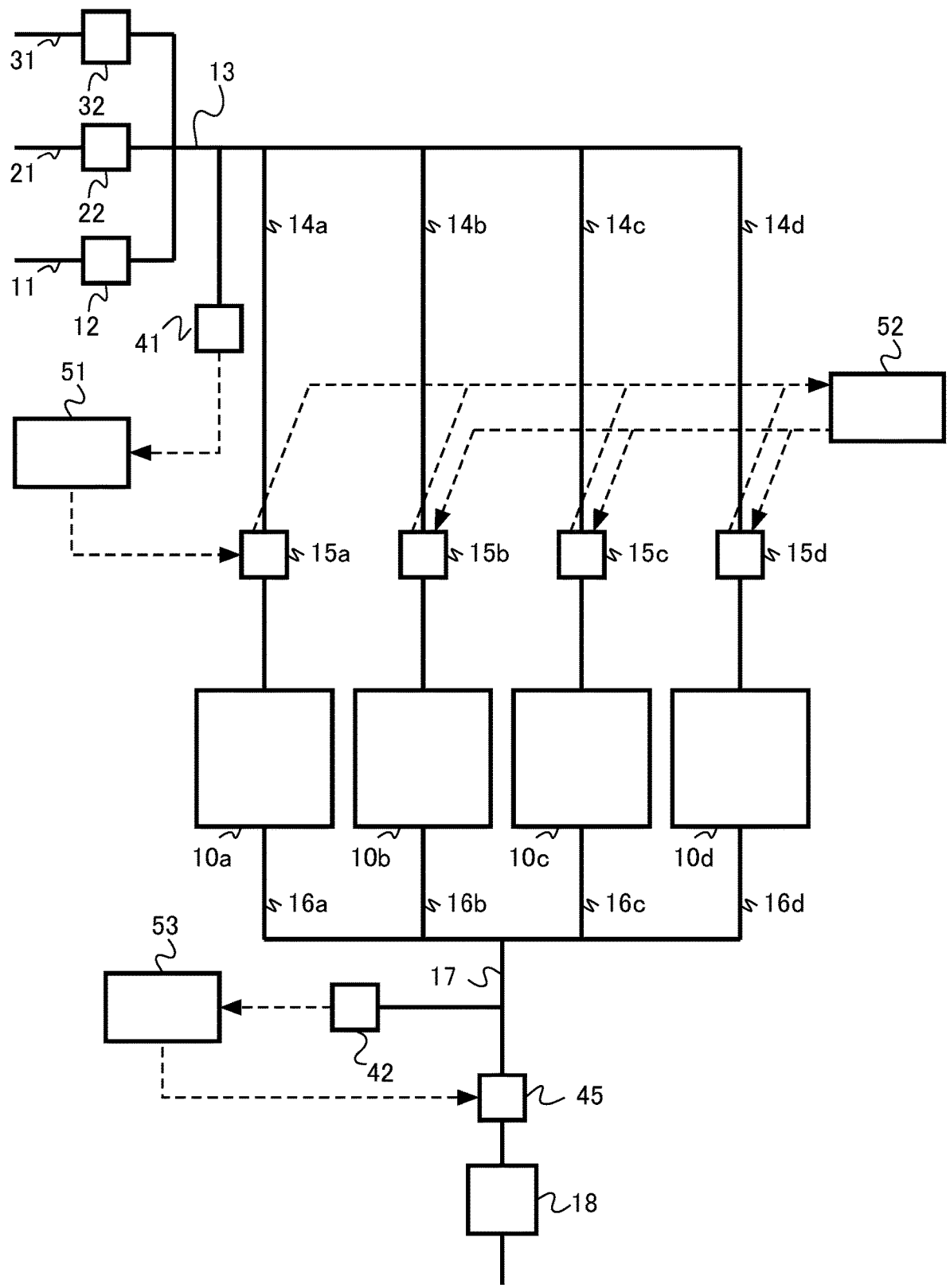
FIG. 1 is a configuration diagram of a vapor phase growth apparatus according to a first embodiment.

FIG. 1 is a configuration diagram of the vapor phase growth apparatus according to the first embodiment. The vapor phase growth apparatus according to the first embodiment is an epitaxial growth apparatus using a metal organic chemical vapor deposition (MOCVD) method. The number of reactors in the epitaxial growth apparatus can be expressed as n (n is an integer of 2 or more). Hereinafter, n=4, that is, a case where the epitaxial growth apparatus includes four reactors will be described as an example. The number of reactors is not limited to four and may be any number of two or more.

The vapor phase growth apparatus according to the first embodiment includes four reactors 10a, 10b, 10c, and 10d, a first gas supply path 11, a second gas supply path 21, a third gas supply path 31, a first primary mass flow controller 12, a second primary mass flow controller 22, a third primary mass flow controller 32, a primary gas supply path 13, a first secondary gas supply path 14a (main secondary gas supply path), a second secondary gas supply path 14b (auxiliary secondary gas supply path), a third secondary gas supply path 14c (auxiliary secondary gas supply path), a fourth secondary gas supply path 14d (auxiliary secondary gas supply path), a first secondary mass flow controller 15a (main flow rate controller), a second secondary mass flow controller 15b (auxiliary flow rate controller), a third secondary mass flow controller 15c (auxiliary flow rate controller), a fourth secondary mass flow controller 15d (auxiliary flow rate controller), a first secondary gas discharge path 16a, a second secondary gas discharge path 16b, a third secondary gas discharge path 16c, a fourth secondary gas discharge path 16d, a primary gas discharge path 17, an exhaust pump 18, a first pressure gauge 41, a second pressure gauge 42, a pressure regulating valve 45, a first control circuit 51, a second control circuit 52, and a third control circuit 53.

Each of the four reactors 10a, 10b, 10c, and 10d is, for example, a vertical single wafer type reactor.

The first gas supply path 11, the second gas supply path 21, and the third gas supply path 31 are connected to the primary gas supply path 13. The first primary mass flow controller 12 is provided in the first gas supply path 11. The second primary mass flow controller 22 is provided in the second gas supply path 21. The third primary mass flow controller 32 is provided in the third gas supply path 31.

The first gas supply path 11 supplies a first process gas (first gas) to the primary gas supply path 13. The first gas supply path 11 supplies a first process gas containing, for example, an organic metal of a group III element and a carrier gas to the primary gas supply path 13. The first process gas is, for example, a gas containing a group III element for forming a group III-V semiconductor film on a wafer.

For example, for a group III source material, a method of supplying a gas saturated with a source material obtained by bringing a carrier gas into contact with the source material by bubbling is often used. In this method, the flow rate of the source gas is determined by a flow rate of the carrier gas. In the case of this method, for example, a pressure control valve that maintains the pressure in the first gas supply path 11 constant is provided instead of the first primary mass flow controller 12.

The group III element is, for example, gallium (Ga), aluminum (Al), or indium (In). In addition, the organic metal is, for example, trimethylgallium (TMG), trimethylaluminum (TMA), or trimethylindium (TMI).

The first primary mass flow controller 12 has a function of controlling the flow rate of the first process gas.

The second gas supply path 21 supplies a second process gas (second gas) to the primary gas supply path 13. The second gas supply path 21 supplies a second process gas containing, for example, a nitrogen compound serving as a source of nitrogen (N) to the primary gas supply path 13.

The nitrogen compound is, for example, ammonia ($NH_3$). The second process gas is, for example, a source gas of a group V element for forming the group III-V semiconductor film on the wafer. The group V element is nitrogen (N).

As the nitrogen compound, any active nitrogen compound may be used. The nitrogen compound is not limited to ammonia, and other nitrogen compounds such as hydrazine, alkyl hydrazine, and alkylamine may be used.

The second primary mass flow controller 22 has a function of controlling the flow rate of the second process gas.

The third gas supply path 31 supplies a third process gas to the primary gas supply path 13. The third process gas is, for example, a dilution gas that dilutes the first process gas and the second process gas. By diluting the first process gas and the second process gas with the dilution gas, concentrations of the group III element and the group V element supplied to the reactors 10a, 10b, 10c, and 10d are adjusted. The dilution gas is, for example, an inert gas such as hydrogen gas, nitrogen gas, or argon gas or a mixed gas thereof.

The third primary mass flow controller 32 has a function of controlling the flow rate of the third process gas.

The first gas supply path 11, the second gas supply path 21, and the third gas supply path 31 are combined and then connected to the primary gas supply path 13. A mixed gas of the first process gas, the second process gas, and the third process gas flows through the primary gas supply path 13. The primary gas supply path 13 supplies the mixed gas of the first process gas, the second process gas, and the third process gas to the reactors 10a, 10b, 10c, and 10d.

The first pressure gauge 41 is connected to the primary gas supply path 13. The first pressure gauge 41 has a function of measuring the pressure in the primary gas supply path 13. The position in the piping system where the first pressure gauge 41 is installed may be anywhere as long as the position is a portion connected to the primary gas supply path 13 without intervening a valve, a flow rate control device, or the like having a large pressure loss. Specifically, in the piping system of FIG. 1, the position may be in a range surrounded by the first primary mass flow controller 12, the second primary mass flow controller 22, the third primary mass flow controller 32, the first secondary mass flow controller 15a, and the second secondary mass flow controller 15b, the third secondary mass flow controller 15c, and the fourth secondary mass flow controller 15d.

The first secondary gas supply path 14a, the second secondary gas supply path 14b, the third secondary gas supply path 14c, and the fourth secondary gas supply path 14d are branched from the primary gas supply path 13. The first secondary gas supply path 14a, the second secondary gas supply path 14b, the third secondary gas supply path 14c, and the fourth secondary gas supply path 14d connected to the reactors 10a, 10b, 10c, and 10d, respectively. The first secondary gas supply path 14a, the second secondary gas supply path 14b, the third secondary gas supply path 14c, and the fourth secondary gas supply path 14d supply the mixed gas to the reactors 10a, 10b, 10c, and 10d, respectively.

The first secondary mass flow controller 15a (main flow rate controller) is provided in the first secondary gas supply path 14a. The second secondary mass flow controller 15b (auxiliary flow rate controller) is provided in the second secondary gas supply path 14b. The third secondary mass flow controller 15c (auxiliary flow rate controller) is provided in the third secondary gas supply path 14c. The fourth secondary mass flow controller 15d (auxiliary flow rate controller) is provided in the fourth secondary gas supply path 14d.

The first secondary mass flow controller 15a has a function of controlling the flow rate of the mixed gas flowing through the first secondary gas supply path 14a. The second secondary mass flow controller 15b has a function of controlling the flow rate of the mixed gas flowing through the second secondary gas supply path 14b. The third secondary mass flow controller 15c has a function of controlling the flow rate of the mixed gas flowing through the third secondary gas supply path 14c. The fourth secondary mass flow controller 15d has a function of controlling the flow rate of the mixed gas flowing through the fourth secondary gas supply path 14d. In addition, these secondary mass flow controllers measure the flow rate of gas flowing through the secondary mass flow controllers and output the measured values to the second control circuit 52.

It is preferable that the first secondary mass flow controller 15a (main flow rate controller), the second secondary mass flow controller 15b, the third secondary mass flow controller 15c, and the fourth secondary mass flow controller 15d be configured by using the mass flow controllers having the same specifications.

The first control circuit 51 has a function of instructing a flow rate value to the first secondary mass flow controller 15a which is one of the four secondary mass flow controllers on the basis of the measurement result of the first pressure gauge 41. The first control circuit 51 has a function of instructing a flow rate value to the first secondary mass flow controller 15a so that the pressure in the primary gas supply path 13 becomes a predetermined value. For example, the first control circuit 51 has a function of instructing the first flow rate value to the first secondary mass flow controller 15a so that the pressure in the primary gas supply path 13 becomes a predetermined value.

The object to be controlled by the first secondary mass flow controller 15a is not a mass flow but a pressure. Therefore, strictly speaking, the first secondary mass flow controller 15a is not a mass flow controller but a pressure controller. However, since the first secondary mass flow controller 15a controls the flow rate of the gas flowing through the first secondary mass flow controller 15a in order to control the pressure, the first secondary mass flow controller 15a is referred to as a mass flow controller for the convenience.

The function required of the first secondary mass flow controller 15a is to maintain the pressure of the first pressure gauge 41 constant by controlling the flow rate of the gas flowing inside itself according to the instruction of the first control circuit 51 and to measure the flow rate of the gas flowing inside itself and to transmit the flow rate to the second control circuit 52. The first secondary mass flow controller 15a can have any configuration that can realize these functions. For example, a pressure controller having a function of measuring and transmitting the flow rate of a gas flowing inside can be used.

The first control circuit 51 performs, for example, proportional-integral-differential control (PID control).

The first control circuit 51 is configured by, for example, hardware or a combination of hardware and software. The first control circuit 51 is, for example, a microcomputer.

The second control circuit 52 has a function of calculating a flow rate value (second flow rate value) that is ¼ of the sum of the flow rate values of the four secondary mass flow controllers. That is, the second control circuit 52 has a function of calculating a flow rate value that is ¼ of the sum of the flow rate values of the first secondary mass flow controller 15a, the second secondary mass flow controller 15b, the third secondary mass flow controller 15c, and the fourth secondary mass flow controller 15d.

The second control circuit 52 has a function of instructing the calculated flow rate value (second flow rate value) to three secondary mass flow controllers other than the first secondary mass flow controller 15a among the four secondary mass flow controllers. In other words, the second control circuit 52 has a function of instructing the calculated flow rate value as a control value to the second secondary mass flow controller 15b, the third secondary mass flow controller 15c, and the fourth secondary mass flow controller 15d.

The second secondary mass flow controller 15b, the third secondary mass flow controller 15c, and the fourth secondary mass flow controller 15d operate by using the flow rate value of ¼ as a control value.

The second control circuit 52 is configured by, for example, hardware or a combination of hardware and software. The second control circuit 52 is, for example, a microcomputer.

The first secondary gas discharge path 16a, the second secondary gas discharge path 16b, the third secondary gas discharge path 16c, and the fourth secondary gas discharge path 16d are connected to the reactors 10a, 10b, 10c, and 10d, respectively. The first secondary gas discharge path 16a, the second secondary gas discharge path 16b, the third secondary gas discharge path 16c, and the fourth secondary gas discharge path 16d become gas flow paths of exhaust gases discharged from the reactors 10a, 10b, 10c, and 10d, respectively.

The primary gas discharge path 17 is connected to the first secondary gas discharge path 16a, the second secondary gas discharge path 16b, the third secondary gas discharge path 16c, and the fourth secondary gas discharge path 16d.

The exhaust pump 18 is connected to the primary gas discharge path 17. The exhaust pump 18 has a function of sucking gases from the reactors 10a, 10b, 10c, and 10d. The exhaust pump 18 is, for example, a vacuum pump.

The second pressure gauge 42 is connected to the primary gas discharge path 17. The second pressure gauge 42 has a function of measuring the pressure in the primary gas discharge path 17.

The pressure regulating valve 45 is provided between the exhaust pump 18 and the second pressure gauge 42. The pressure regulating valve 45 has a function of regulating the pressures in the reactors 10a, 10b, 10c, and 10d and the primary gas discharge path 17. The pressure regulating valve 45 is, for example, a butterfly valve.

The third control circuit 53 has a function of instructing to the pressure regulating valve 45 on the basis of a measurement result of the second pressure gauge 42 to control the pressures in the reactors 10a, 10b, 10c, and 10d and the primary gas discharge path 17 to predetermined values.

Originally, the pressure to be controlled by the pressure regulating valve 45 is the pressure in each of the reactors (10a, 10b, 10c, and 10d) in which film formation is actually performed. However, if the difference between the pressure at the installation position of the second pressure gauge 42 and the pressure in each reactor is constant, the pressure in each reactor can be controlled to a predetermined value by considering the difference in advance. More preferably, the difference between the pressure at the installation position of the second pressure gauge 42 and the pressure in each of the reactors is made small enough to be ignored. A preferable range of the pressure difference is 0.5 kPa or less, more preferably 0.1 kPa or less.

In order to realize the preferred pressure difference, in consideration of the gas flow rate and the gas type to be used, the diameter of the pipe between each reactor and the second pressure gauge 42 is made sufficiently large, or the length of the pipe is made sufficiently short. In addition, a method of making the length of the pipe from each reactor to the second pressure gauge 42 as uniform as possible can be used. Moreover, the pressure gauge of one reactor among the reactors may be used as the second pressure gauge 42.

The third control circuit 53 is configured by, for example, hardware or a combination of hardware and software. The third control circuit 53 is, for example, a microcomputer.

Figure 2:
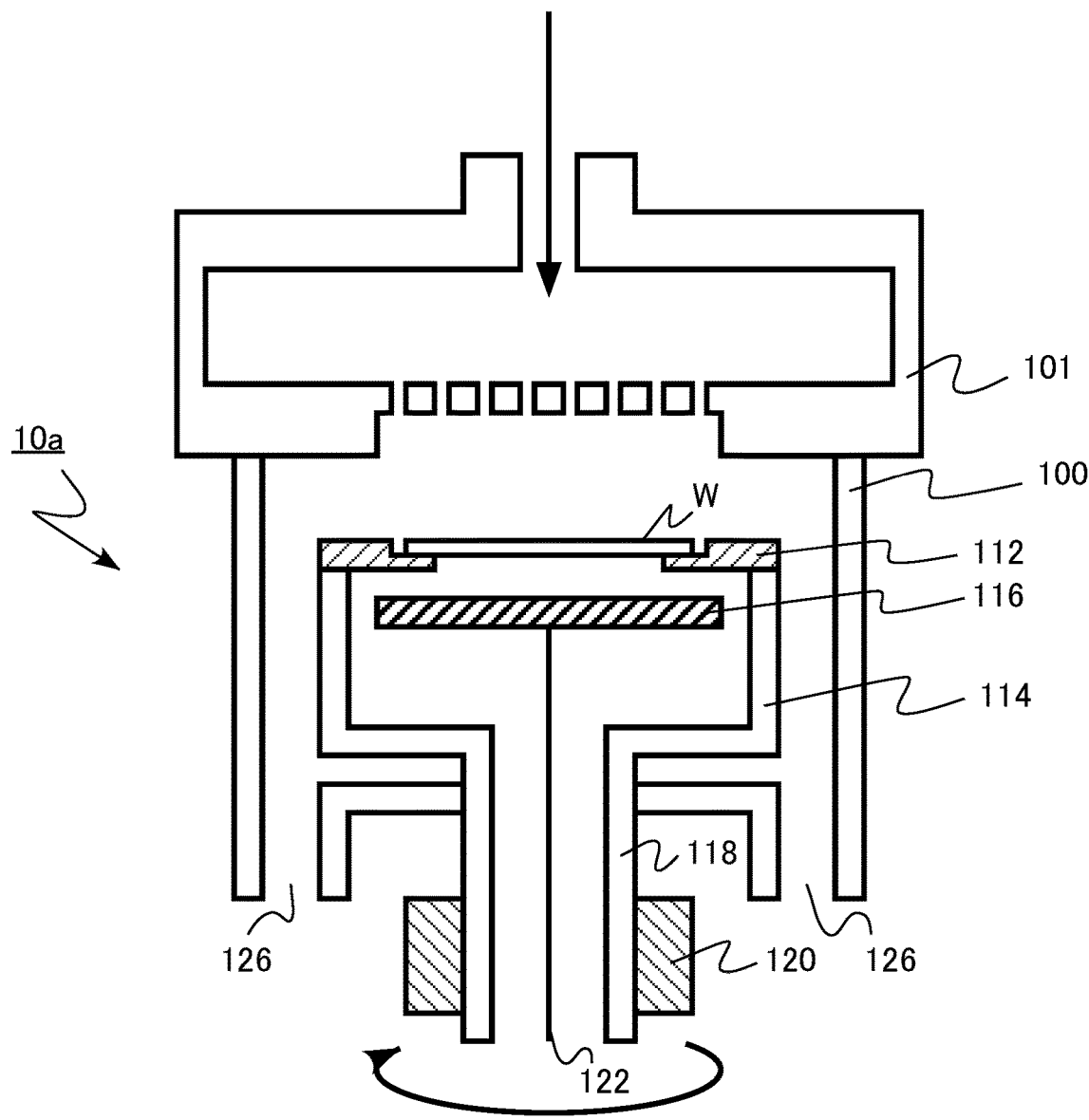
FIG. 2 is a schematic cross-sectional view of a reactor of the vapor phase growth apparatus according to the first embodiment.

FIG. 2 is a schematic cross-sectional view of the reactor of the vapor phase growth apparatus according to the first embodiment. One of the four reactors 10a, 10b, 10c, and 10d, for example, the reactor 10a is illustrated. Incidentally, it is desirable that all the four reactors 10a, 10b, 10c, and 10d have the same configuration.

As illustrated in FIG. 2, the reactor 10a of the first embodiment is provided with a wall surface 100 which is, for example, a cylindrical hollow body made of stainless steel. A shower plate 101 is provided above the reactor 10a. The shower plate 101 supplies the process gases into the reactor 10a.

In addition, a support unit 112 is provided in the reactor 10a. The support unit 112 can allow a semiconductor wafer (substrate) W to be mounted thereon. The support unit 112 is, for example, an annular holder provided with an opening at the center or a susceptor without an opening.

The first secondary gas supply path 14a is connected to the shower plate 101. A plurality of gas ejection holes for ejecting the mixed gas into the reactor 10a are provided on the reactor 10a side of the shower plate 101.

In addition, the reactor 10a includes a rotating body unit 114. A support unit 112 is provided on the upper portion of the rotating body unit 114. The rotating body unit 114 has a rotation shaft 118 connected to the rotation drive mechanism 120. The rotation drive mechanism 120 can rotate the semiconductor wafer W mounted on the support unit 112 at a rotational speed of, for example, 50 rpm or more and 3000 rpm or less.

In addition, the rotating body unit 114 includes a heating unit 116 that heats the wafer W mounted on the support unit 112. The heating unit 116 is, for example, a heater.

The heating unit 116 is fixedly provided in the rotating body unit 114. Electric power is supplied to the heating unit 116 via an electrode 122 that penetrates the inside of the rotation shaft 118, and the heating of the wafer W can be controlled by the heating unit 116. In addition, in order to detach the semiconductor wafer W from the support unit 112, push up pins (not illustrated) penetrating the heating unit 116 may be provided.

Furthermore, a gas discharge unit 126 is provided at the bottom of the reactor 10a. The gas discharge unit 126 discharges the reaction product after the source gases have reacted on the surface of the semiconductor wafer W and the process gases remaining in the reactor 10a to the outside of the reactor 10a. The gas discharge unit 126 is connected to the first secondary gas discharge path 16a (FIG. 1).

The wall surface 100 of the reactor 10a is provided with a wafer inlet/outlet and a gate valve (not illustrated). The semiconductor wafer W can be loaded into the reactor 10a or unloaded from the reactor 10a by the wafer inlet/outlet and the gate valve.

The vapor phase growth method according to the first embodiment uses the epitaxial growth apparatus illustrated in FIGS. 1 and 2. Hereinafter, the vapor phase growth method according to the first embodiment will be described. A case where a gallium nitride film (GaN film) is formed on a silicon substrate will be described as an example.

First, one silicon wafer W is loaded into each of the four reactors 10a, 10b, 10c, and 10d.

A first process gas containing TMG is supplied from the first gas supply path 11 to the primary gas supply path 13. The flow rate of the first process gas is controlled to a desired flow rate by the first primary mass flow controller 12.

A second process gas containing ammonia is supplied from the second gas supply path 21 to the primary gas supply path 13. The flow rate of the second process gas is controlled to a desired flow rate by the second primary mass flow controller 22.

A third process gas containing hydrogen is supplied from the third gas supply path 31 to the primary gas supply path 13. The flow rate of the third process gas is controlled to a desired flow rate by the third primary mass flow controller 32.

The first process gas, the second process gas, and the third process gas become a mixed gas in the primary gas supply path 13. The mixed gas passes through the first secondary gas supply path 14a, the second secondary gas supply path 14b, the third secondary gas supply path 14c, and the fourth secondary gas supply path 14d to be supplied to the four reactors 10a, 10b, 10c, and 10d.

The vapor phase growth apparatus is controlled so that the mixed gases having an equal flow rate flow through the first secondary gas supply path 14a, the second secondary gas supply path 14b, the third secondary gas supply path 14c, and the fourth secondary gas supply path 14d, respectively.

The first control circuit 51 instructs a flow rate value to the first secondary mass flow controller 15a, which is one of the four secondary mass flow controllers, on the basis of a measurement result of the first pressure gauge 41. The first control circuit 51 instructs the flow rate value to the first secondary mass flow controller 15a so that the pressure in the primary gas supply path 13 becomes a predetermined value.

The pressures in the reactors 10a, 10b, 10c, and 10d are maintained at predetermined pressures necessary for forming the GaN film. The pressures in the reactors 10a, 10b, 10c, and 10d are maintained at predetermined pressures by using the exhaust pump 18, the pressure regulating valve 45, the second pressure gauge 42, and the third control circuit 53.

In order to operate the four secondary mass flow controllers of the first secondary mass flow controller 15a, the second secondary mass flow controller 15b, the third secondary mass flow controller 15c, and the fourth secondary mass flow controller 15d, a predetermined differential pressure is required for the pressures of the upstream and downstream sides of the secondary mass flow controllers. Specifically, the difference (P1–P2) between the first pressure P1 measured by the first pressure gauge 41 and the second pressure P2 measured by the second pressure gauge 42 is required to be within a predetermined pressure range.

The first control circuit 51 controls the first secondary mass flow controller 15a by PID control so that the pressure P1 in the primary gas supply path 13 becomes a predetermined value.

The flow rate values measured by secondary mass flow controllers are transmitted from the four secondary mass flow controllers of the first secondary mass flow controller 15a, the second secondary mass flow controller 15b, the third secondary mass flow controller 15c, and the fourth secondary mass flow controller 15d to the second control circuit 52.

The second control circuit 52 calculates a flow rate value (second flow rate value) that is a ¼ of the sum of the flow rate values transmitted from the four secondary mass flow controllers. Then, the second secondary mass flow controller 15b, the third secondary mass flow controller 15c, and the fourth secondary mass flow controller 15d are instructed with the calculated flow rate value as a control value.

By the above control method, the mixed gas passing through the first secondary gas supply path 14a, the second secondary gas supply path 14b, the third secondary gas supply path 14c, and the fourth secondary gas supply path 14d is equally divided into four. Therefore, the mixed gas supplied to the four reactors 10a, 10b, 10c, and 10d is equally divided into four. The flow rates of the mixed gas supplied to the four reactors 10a, 10b, 10c, and 10d become uniform.

The control values of process parameters set for the reactors 10a, 10b, 10c, and 10d are set to values at which the film thickness and composition of the grown films are the same in the reactors 10a, 10b, 10c, and 10d. For example, the four silicon wafers W of the four reactors 10a, 10b, 10c, and 10d are controlled to the same rotational speed and the same temperature.

By the above-described vapor phase growth method, the mixed gas is supplied to each of the reactors 10a, 10b, 10c, and 10d, so that GaN films are simultaneously formed on the four silicon wafers W.

Hereinafter, the functions and effects of the vapor phase growth apparatus and the vapor phase growth method of the first embodiment will be described.

In a case where films having the same characteristics are simultaneously grown on a plurality of substrates by using a plurality of the reactors, the process parameters of the respective reactors are set to the same control value. By setting the process parameters of the respective reactors to the same control value, it is theoretically possible to simultaneously grow the films having the same characteristics on the plurality of substrates.

However, even if the process parameters of the respective reactors are set to the same control value, in some cases, there may be variations in the characteristics of the films grown in the respective reactors. For example, if the flow rates of the process gases supplied to the respective reactors vary, the characteristics of the films grown in the reactors vary. For this reason, it is necessary to control the flow rates of the process gases supplied to the respective reactors to be uniform.

For example, considered is a case where the process gas is divided into four and supplied to four reactors. The primary gas supply path is divided into four secondary gas supply paths. The total flow rate of the process gases is controlled to a desired flow rate by the primary mass flow controller provided in the primary gas supply path. In addition, the flow rates of the process gases flowing through the secondary gas supply paths are controlled by the secondary mass flow controllers provided in the four secondary gas supply paths.

For example, flow rate values obtained by dividing the total flow rate of the process gas into four are set to the four secondary mass flow controllers. The primary mass flow controller and the secondary mass flow controllers have certain errors in flow control accuracy. For this reason, in some cases, the actual total flow rate may be less than the sum of the flow rate values divided into four. In this case, there is no difference in pressure between the upstream and downstream sides of the secondary mass flow controllers, and thus, the secondary mass flow controller does not operate normally, so that the flow rate cannot be controlled. Therefore, the flow rate of the process gas supplied to each reactor varies greatly. Accordingly, it is necessary to ensure a predetermined differential pressure at least between the pressures of the upstream and downstream sides of the secondary mass flow controllers. The predetermined differential pressure is, for example, 50 kPa or more and 300 kPa or less.

In the vapor phase growth apparatus according to the first embodiment, the first control circuit 51 instructs the first flow rate value to the first secondary mass flow controller 15a so that the pressure P1 in the primary gas supply path 13 becomes a predetermined value. The control value of the pressure P1 in the primary gas supply path 13 is determined so as to satisfy the predetermined differential pressure. Therefore, a predetermined differential pressure is always ensured between the upstream and downstream pressures of the four secondary mass flow controllers. Accordingly, a situation in which the secondary mass flow controller does not operate normally and the flow rate cannot be controlled does not occur.

Furthermore, in the vapor phase growth apparatus according to the first embodiment, the second control circuit 52 calculates a flow rate value that is a ¼ of the sum of the flow rate values transmitted from the four secondary mass flow controllers. Then, the second secondary mass flow controller 15b, the third secondary mass flow controller 15c, and the fourth secondary mass flow controller 15d are instructed with the calculated flow rate value as a control value. Therefore, the mixed gas passing through the first secondary gas supply path 14a, the second secondary gas supply path 14b, the third secondary gas supply path 14c, and the fourth secondary gas supply path 14d is equally divided into four.

In addition, in the vapor phase growth apparatus according to the first embodiment, the process gas flowing through the primary gas supply path 13 is a mixed gas. In general, it is difficult for a mass flow controller to accurately control the flow rate of a mixed gas. This is due to the following reason.

The mass flow controller obtains the flow rate of the process gas flowing through the narrow pipe by detecting a physical change corresponding to the flow rate generated in the narrow pipe. As an example of the physical change, a temperature difference between the upstream and downstream portions of the narrow pipe can be exemplified. Specifically, in a case where the process gas does not flow through the heated narrow pipe, there is no temperature difference between the upstream and downstream portions of the narrow pipe, and in a case where the process gas flows through the narrow pipe, in general, the temperature difference becomes large in proportion to the flow rate. At the time of obtaining the flow rate of the process gas flowing through the narrow pipe by using the physical change, a conversion factor specific to the process gas is used. For example, in the case of a method of detecting the temperature difference between the upstream and downstream portions of the narrow pipe, when the conversion factor of nitrogen gas is assumed to be 1 as a reference value, the conversion factor of helium gas becomes 1.4. By using this conversion factor, the measured flow rate value is corrected to obtain the flow rate of helium gas.

In a case where the process gas is a mixed gas, the conversion factor varies depending on the ratio and type of the mixed gas. That is, it is difficult to determine the conversion factor in the case of changing the ratio and type of the mixed gas, and it is difficult to accurately obtain the flow rate of the mixed gas.

For the reasons described above, in a case where the process gas flowing through the secondary mass flow controller is a mixed gas, the flow rate cannot be obtained accurately. However, the flow rate of the process gas flowing through the secondary mass flow controller obtained by using a certain conversion factor is proportional to the accurate flow rate unless the component ratio of the mixed gas is changed. In other words, even though an accurate flow rate cannot be obtained, the flow rate can be compared between the secondary mass flow controllers.

Therefore, although the exact flow rate is not known, the control value of each secondary mass flow controller is set to ¼ of the sum of flow rates of the secondary mass flow controllers obtained by using the same conversion factor, so that each secondary mass flow controller can be controlled with the flow rate that is ¼ of the total flow rate without known accurate flow rate. However, the first secondary mass flow controller 15a controls the flow rate of the gas flowing through the first secondary mass flow controller so that the pressure P1 in the primary gas supply path 13 becomes a predetermined control value.

Specifically, the second control circuit 52 calculates a flow rate value that is ¼ of the sum of the flow rate values transmitted from the four secondary mass flow controllers. Then, the second secondary mass flow controller 15b, the third secondary mass flow controller 15c, and the fourth secondary mass flow controller 15d are instructed with the calculated flow rate value as a control value.

By controlling the secondary mass flow controller as described above, even if the conversion factor of the mixed gas is unknown, it is possible to control the second secondary mass flow controller 15b, the third secondary mass flow controller 15c, and the fourth secondary mass flow controller 15d. In other words, it is possible to perform control using a flow rate value not corrected by the conversion factor.

Incidentally, in the case of controlling the secondary mass flow controllers as described above, the flow rate detection methods of the secondary mass flow controllers need to be the same. If the flow rate detection methods are different, the same conversion factor cannot be used in a case where the gas type changes, and the flow rates of the mixed gases cannot be compared between the secondary mass flow controllers. More preferably, the secondary mass flow controllers having the same specifications such as maximum flow rate, responsiveness, and gas flow rate control method are used.

Therefore, according to the vapor phase growth apparatus according to the first embodiment, at the time of simultaneously forming films on a plurality of substrates in a plurality of reactors, the flow rates of the process gases supplied to the respective reactors can be controlled so as to be uniform. Therefore, it is possible to simultaneously form films having uniform characteristics in the respective reactors.

Second Embodiment

A vapor phase growth apparatus according to a second embodiment includes: n (n is an integer of 2 or more) reactors; a primary gas supply path supplying a gas to the reactors; n secondary gas supply paths branched from the primary gas supply path, each of the secondary gas supply paths connected corresponding to each of n the reactors, and the secondary gas supply paths including a main secondary gas supply path and (n−1) auxiliary secondary gas supply paths; a first pressure gauge measuring a pressure in the primary gas supply path; a main flow rate controller provided in the main secondary gas supply path; (n−1) auxiliary flow rate controllers each provided in one of the auxiliary secondary gas supply paths; a first control circuit instructing a first flow rate value to the main flow rate controller on the basis of a measurement result of the first pressure gauge; and a second control circuit calculating a second flow rate value, the second flow rate value being 1/n of a sum of a flow rate value measured by the main flow rate controller and flow rate values measured by the auxiliary flow rate controllers, the second control circuit instructing the second flow rate value to the auxiliary flow rate controllers.

The vapor phase growth apparatus according to the second embodiment is different from that of the first embodiment in that the gas supplied to the reactor is a gas having a single composition. Hereinafter, a portion of redundant contents of the first embodiment is omitted in description.

Figure 3:
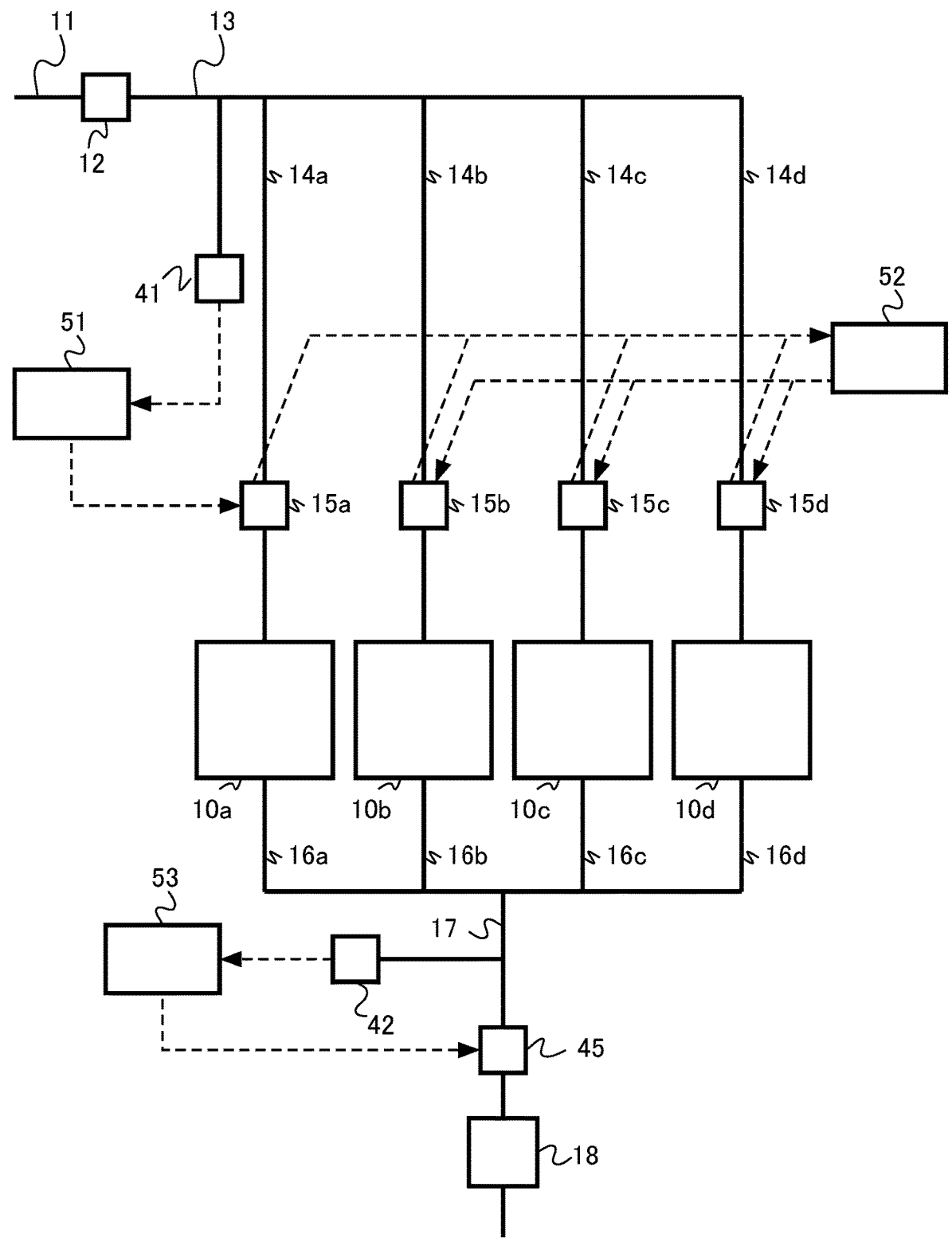
FIG. 3 is a configuration diagram of a vapor phase growth apparatus according to a second embodiment.

FIG. 3 is a configuration diagram of the vapor phase growth apparatus according to the second embodiment. Each configuration corresponds to that of the first embodiment, but the second embodiment is different from the first embodiment in that the second embodiment does not include the second gas supply path 21, the third gas supply path 31, the second primary mass flow controller 22, and the third primary mass flow controller 32.

The primary gas supply path 13 is supplied with a process gas having a single composition which is supplied from the first gas supply path 11 and of which flow rate is controlled by the first primary mass flow controller 12. The process gas is a gas containing, for example, silane. For example, a polycrystalline silicon film is formed on the wafer W by using the vapor phase growth apparatus according to the second embodiment.

According to the vapor phase growth apparatus according to the second embodiment, similarly to the vapor phase growth apparatus according to the first embodiment, at the time of simultaneously forming films on substrates in a plurality of reactors, the flow rates of the process gases supplied to the respective reactors can be controlled so as to be uniform. Therefore, it is possible to simultaneously form films having uniform characteristics in the respective reactors.

Third Embodiment

The vapor phase growth apparatus according to the third embodiment is different from the vapor phase growth apparatus according to the first embodiment in that different types of process gases are mixed in each reactor or just before the reactor and in that a divisional mechanism is provided for each of the different types of process gases. Specifically, each of the first primary process gas, the second primary process gas, and the third primary process gas is divided and supplied to n reactors, and the process gases are mixed inside each reactor or just before the reactor. Hereinafter, a portion of redundant contents of the first embodiment is omitted in description.

Figure 4:
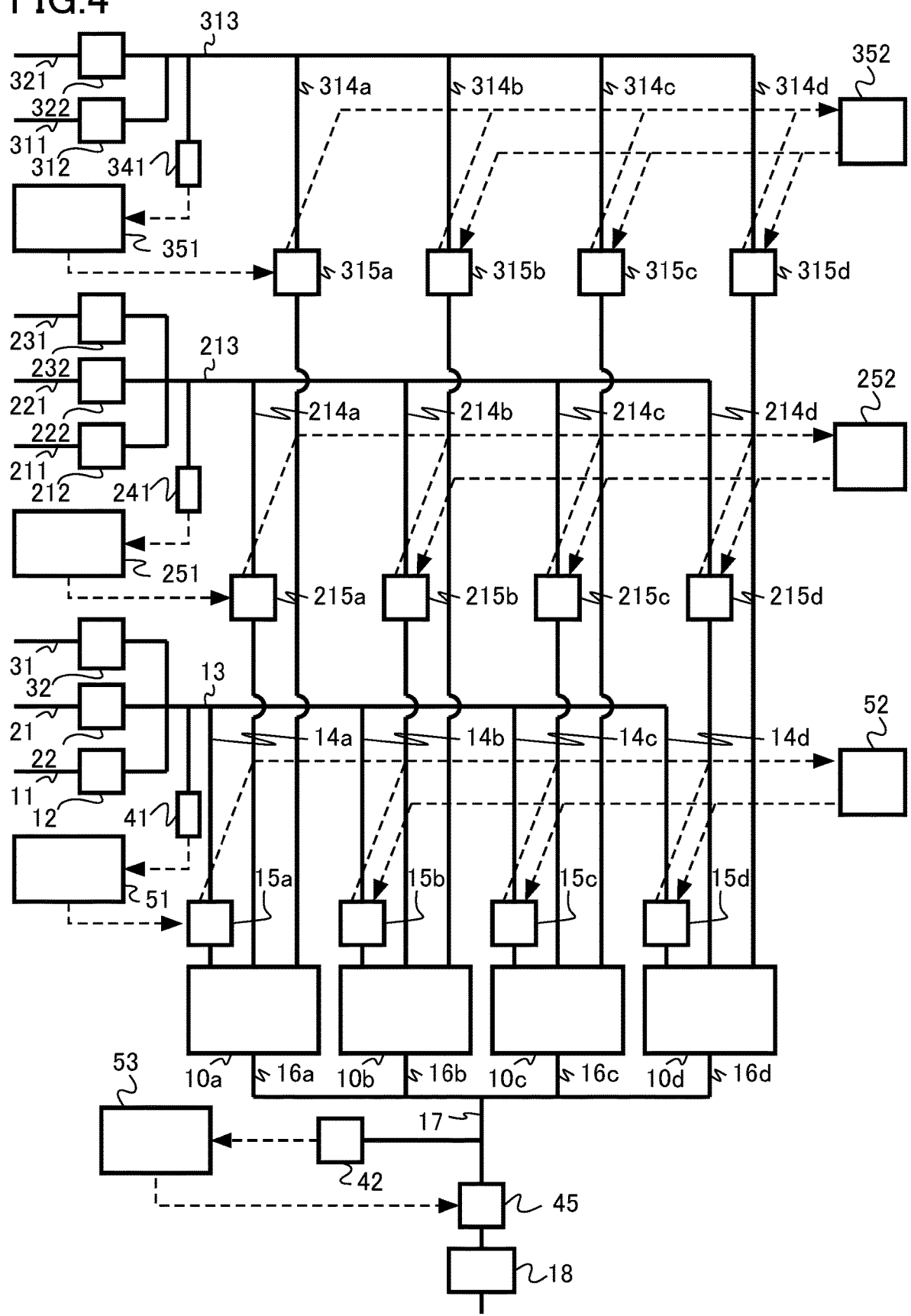
FIG. 4 is a configuration diagram of a vapor phase growth apparatus according to a third embodiment.

FIG. 4 is a configuration diagram of the vapor phase growth apparatus according to the third embodiment.

The first gas supply path 11, the second gas supply path 21, and the third gas supply path 31 are connected to a first primary gas supply path 13. The first primary mass flow controller 12 is provided in the first gas supply path 11 for supplying a first process gas (for example, a gas containing an organic metal of a group III element). The second primary mass flow controller 22 is provided in the second gas supply path 21 for supplying a second process gas (for example, hydrogen gas). The third primary mass flow controller 32 is provided in the third gas supply path 31 for supplying a third process gas (for example, nitrogen gas). The first primary gas supply path 13 supplies a first primary process gas which is a mixed gas of the first process gas, the second process gas, and the third process gas to the reactors 10a, 10b, 10c, and 10d.

A fourth gas supply path 211, a fifth gas supply path 221, and a sixth gas supply path 231 are connected to a second primary gas supply path 213. A fourth primary mass flow controller 212 is provided in the fourth gas supply path 211 for supplying a fourth process gas (for example, ammonia NH$_3$). A fifth primary mass flow controller 222 is provided in the fifth gas supply path 221 for supplying a fifth process gas (for example, hydrogen gas). A sixth primary mass flow controller 232 is provided in the sixth gas supply path 231 for supplying a sixth process gas (for example, nitrogen gas). The second primary gas supply path 213 supplies a second primary process gas which is a mixed gas of the fourth process gas, the fifth process gas, and the sixth process gas to the reactors 10a, 10b, 10c, and 10d.

A seventh gas supply path 311 and an eighth gas supply path 321 are connected to a third primary gas supply path 313. A seventh primary mass flow controller 312 is provided in the seventh gas supply path 311 for supplying a seventh process gas (for example, hydrogen gas). An eighth primary mass flow controller 322 is provided in the eighth gas supply path 321 for supplying an eighth process gas (for example, nitrogen gas). The third primary gas supply path 313 supplies a third primary process gas which is a mixed gas of the seventh process gas and the eighth process gas and which is a dilution gas for diluting, for example, the first primary process gas and the second primary process gas to the reactors 10a, 10b, 10c, and 10d.

The first secondary gas supply path 14a (main secondary gas supply path), the second secondary gas supply path 14b (auxiliary secondary gas supply path), the third secondary gas supply path 14c (auxiliary secondary gas supply path), and the fourth secondary gas supply path 14d (auxiliary secondary gas supply path) are branched from the first primary gas supply path 13. A first secondary mass flow controller 15a (main flow rate controller), a second secondary mass flow controller 15b (auxiliary flow rate controller), a third secondary mass flow controller 15c (auxiliary flow rate controller), and a fourth secondary mass flow controller 15d (auxiliary flow rate controller) for controlling the flow rates are provided in the first secondary gas supply path 14a, the second secondary gas supply path 14b, the third secondary gas supply path 14c, and the fourth secondary gas supply path 14d, respectively.

Similarly, a fifth secondary gas supply path 214a, a sixth secondary gas supply path 214b, a seventh secondary gas supply path 214c, and an eighth secondary gas supply path 214d are branched from the second primary gas supply path 213. A fifth secondary mass flow controller 215a (main flow rate controller), a sixth secondary mass flow controller 215b (auxiliary flow rate controller), a seventh secondary mass flow controller 215c (auxiliary flow rate controller), and an eighth secondary mass flow controller 215d (auxiliary flow rate controller) for controlling the flow rates are provided in the fifth secondary gas supply path 214a, the sixth secondary gas supply path 214b, the seventh secondary gas supply path 214c, and the eighth secondary gas supply path 214d, respectively.

Similarly, a ninth secondary gas supply path 314a, a tenth secondary gas supply path 314b, an eleventh secondary gas supply path 314c, and a twelfth secondary gas supply path 314d are branched from the third primary gas supply path 313. A ninth secondary mass flow controller 315a (main flow rate controller), a tenth secondary mass flow controller 315b (auxiliary flow rate controller), an eleventh secondary mass flow controller 315c (auxiliary flow rate controller), and a twelfth secondary mass flow controller 315d (auxiliary flow rate controller) for controlling the flow rates are provided in the ninth secondary gas supply path 314a, the tenth secondary gas supply path 314b, the eleventh secondary gas supply path 314c, and the twelfth secondary gas supply path 314d, respectively.

Similarly to the first embodiment, a first pressure gauge 41 is provided in the first primary gas supply path 13 so as to maintain the pressure in the first primary gas supply path 13 constant, and a first control circuit 51 controls the first secondary mass flow controller 15a. Then, the flow rate value of the first secondary mass flow controller 15a is transmitted to the second control circuit 52, and the other secondary mass flow controllers are controlled by the flow rate control value calculated by the second control circuit 52.

Similarly, a third pressure gauge 241 is provided in the second primary gas supply path 213, and a fourth control circuit 251 controls the fifth secondary mass flow controller 215a so as to maintain the pressure in the second primary gas supply path 213 constant. Then, the flow rate value of the fifth secondary mass flow controller 215a is transmitted to the fifth control circuit 252, and the other secondary mass flow controllers are controlled by the flow rate control value calculated by the fifth control circuit 252.

Similarly, a fourth pressure gauge 341 is provided in the third primary gas supply path 313, and a sixth control circuit 351 controls the ninth secondary mass flow controller 315a so as to maintain the pressure of the third primary gas supply path 313 constant. Then, the flow rate value of the ninth secondary mass flow controller 315a is transmitted to the seventh control circuit 352, and the other secondary mass flow controller is controlled by the flow rate control value calculated by the seventh control circuit 352.

The first primary process gas, the second primary process gas, and the third primary process gas are mixed inside or just before the four reactors 10a, 10b, 10c, and 10d.

According to the vapor phase growth apparatus according to the third embodiment, similarly to the vapor phase growth apparatus according to the first embodiment, at the time of simultaneously forming films on substrates in a plurality of reactors, the flow rates of the process gases supplied to the respective reactors can be controlled so as to be uniform. Therefore, it is possible to simultaneously form films having uniform characteristics in the respective reactors.

Furthermore, according to the vapor phase growth apparatus according to the third embodiment, the first primary process gas, the second primary process gas, and the third primary process gas are mixed inside or just before the reactor, so that an effect such as suppressing a chemical reaction between the primary process gases can be expected.

The embodiments have been described above with reference to specific examples. The above embodiments are merely given as examples and do not limit embodiments. Moreover, the components of the embodiments may be combined appropriately.

In addition, in the above-described embodiments, examples in which the pressure after collection of exhaust gases from a plurality of reactors is controlled by one pressure control valve in order to control the pressures of the plurality of reactors have been described. However, a pressure control valve is provided for each reactor in the portion closer to the reactor than the portion that collects the exhaust gases from a plurality of reactors, and the pressure control may be performed for each reactor on the basis of the pressure measured by the pressure gauge provided for each reactor.

In the embodiments, cases where the GaN film and the polycrystalline silicon film are formed has been described as examples. However, embodiments can be applied to the formation of other films.

In the embodiments, the description of the portion of the vapor phase growth apparatus that is not directly required for the description of embodiments is omitted, but the required apparatus configurations and the like of the vapor phase growth apparatus can be appropriately selected and used. Besides, all vapor phase growth apparatuses that include the elements of embodiments and can be appropriately modified by those skilled in the art are included within the scope of embodiments. The scope of embodiments is defined by the claims and equivalents thereof.

What is claimed is:

1. A vapor phase growth apparatus comprising:
   n (n is an integer of 2 or more) reactors;
   a primary gas supply path supplying a mixed gas including a first gas and a second gas to the reactors;
   n secondary gas supply paths branched from the primary gas supply path, each of the secondary gas supply paths connected corresponding to each of the n reactors, and the secondary gas supply paths including a main secondary gas supply path and (n−1) auxiliary secondary gas supply paths;
   a first pressure gauge measuring a pressure in the primary gas supply path;
   a main flow rate controller provided in the main secondary gas supply path;
   (n−1) auxiliary flow rate controllers each provided in one of the auxiliary secondary gas supply paths;
   a first control circuit instructing a first flow rate value to the main flow rate controller on the basis of a measurement result of the first pressure gauge; and
   a second control circuit calculating a second flow rate value, the second flow rate value being 1/n of a sum of a flow rate value measured by the main flow rate controller and flow rate values measured by the auxiliary flow rate controllers, the second control circuit instructing the second flow rate value to each of the auxiliary flow rate controllers.

2. The vapor phase growth apparatus according to claim 1, further comprising:
   n secondary gas discharge paths each connected corresponding to each of the n reactors;
   a primary gas discharge path connected to the secondary gas discharge paths;
   an exhaust pump connected to the primary gas discharge path;
   a second pressure gauge measuring a pressure in the primary gas discharge path;
   a pressure regulating valve provided between the exhaust pump and the second pressure gauge; and
   a third control circuit instructing the pressure regulating valve on the basis of a measurement result of the second pressure gauge to control the pressure in the primary gas discharge path.

3. The vapor phase growth apparatus according to claim 1, further comprising:
   a first gas supply path supplying the first gas to the primary gas supply path; and
   a second gas supply path supplying the second gas to the primary gas supply path.

4. The vapor phase growth apparatus according to claim 1, wherein the first control circuit instructs the first flow rate value to the main flow rate controller so that the pressure in the primary gas supply path becomes a predetermined value.

5. The vapor phase growth apparatus according to claim 1, wherein the first control circuit performs proportional-integral-differential control.

6. The vapor phase growth apparatus according to claim 1, wherein the first gas contains a group III element, and the second gas contains a nitrogen compound.

7. A vapor phase growth apparatus comprising:
   n (n is an integer of 2 or more) reactors;
   a primary gas supply path supplying a gas to the reactors;
   n secondary gas supply paths branched from the primary gas supply path, each of the secondary gas supply paths connected corresponding to each of the n reactors, and the secondary gas supply paths including a main secondary gas supply path and (n−1) auxiliary secondary gas supply paths;
   a first pressure gauge measuring a pressure in the primary gas supply path;
   a main flow rate controller provided in the main secondary gas supply path;

(n−1) auxiliary flow rate controllers each provided in one of the auxiliary secondary gas supply paths;

a first control circuit instructing a first flow rate value to the main flow rate controller on the basis of a measurement result of the first pressure gauge; and a second control circuit calculating a second flow rate value, the second flow rate value being 1/n of a sum of a flow rate value measured by the main flow rate controller and flow rate values measured by the auxiliary flow rate controllers, the second control circuit instructing the second flow rate value to the auxiliary flow rate controllers.

8. The vapor phase growth apparatus according to claim 7, further comprising:

n secondary gas discharge paths each connected corresponding to each of the n reactors;

a primary gas discharge path connected to the secondary gas discharge paths;

an exhaust pump connected to the primary gas discharge path;

a second pressure gauge measuring a pressure in the primary gas discharge path;

a pressure regulating valve provided between the exhaust pump and the second pressure gauge; and a third control circuit instructing the pressure regulating valve on the basis of a measurement result of the second pressure gauge to control the pressure in the primary gas discharge path.

9. The vapor phase growth apparatus according to claim 7, wherein the first control circuit instructs the first flow rate value to the main flow rate controller so that the pressure in the primary gas supply path becomes a predetermined value.

10. The vapor phase growth apparatus according to claim 7, wherein the first control circuit performs proportional-integral-differential control.

11. The vapor phase growth apparatus according to claim 7, wherein the gas contains silane.

* * * * *